United States Patent [19]

Hubbell

[11] Patent Number: 5,994,891
[45] Date of Patent: Nov. 30, 1999

[54] ELECTRICALLY SMALL, WIDEBAND, HIGH DYNAMIC RANGE ANTENNA HAVING A SERIAL ARRAY OF OPTICAL MODULATORS

[75] Inventor: Stephen P. Hubbell, Gig Harbor, Wash.

[73] Assignee: The Boeing Company, Seattle, Wash.

[21] Appl. No.: 08/794,564

[22] Filed: Feb. 3, 1997

Related U.S. Application Data

[63] Continuation-in-part of application No. 08/469,393, Jun. 6, 1995, which is a continuation-in-part of application No. 08/313,506, Sep. 26, 1994, Pat. No. 5,600,242.

[51] Int. Cl.⁶ .................. G01R 29/12; G01R 33/032; G01J 9/02; G02F 1/00
[52] U.S. Cl. .................. 324/96; 250/227.19; 324/72; 324/244.1; 324/248; 356/345
[58] Field of Search .................. 324/244, 244.1, 324/247, 248, 260, 96, 72; 505/162, 845, 846, 848; 327/510; 356/345; 385/12, 13; 250/227.18, 227.19

[56] References Cited

U.S. PATENT DOCUMENTS

| 4,454,522 | 6/1984 | de Lozanne . | |
|---|---|---|---|
| 4,814,706 | 3/1989 | Rempt . | |
| 4,904,940 | 2/1990 | Rempt . | |
| 4,906,929 | 3/1990 | Rempt . | |
| 5,134,117 | 7/1992 | DiLorio et al. . | |
| 5,194,807 | 3/1993 | Ueda | 324/248 |
| 5,227,715 | 7/1993 | Ito et al. | 324/244.1 X |
| 5,278,499 | 1/1994 | Ito et al. | 324/244.1 |
| 5,326,986 | 7/1994 | Miller, Jr. et al. | 324/248 X |
| 5,331,162 | 7/1994 | Silver et al. | 505/848 X |
| 5,600,242 | 2/1997 | Hubbell | 324/248 |

FOREIGN PATENT DOCUMENTS

| 301301 | 11/1992 | Germany . | |
|---|---|---|---|
| 50975 | 2/1989 | Japan . | |
| 298878 | 12/1990 | Japan . | |
| 116477 | 4/1992 | Japan . | |
| 160380 | 6/1992 | Japan . | |
| 204069 | 7/1992 | Japan . | |
| 6-138197 | 5/1994 | Japan | 324/248 |

OTHER PUBLICATIONS

R. Welty, et al., "Two–Stage Integrated SQUID Amplifier with Series Array Output," NIST Cryogenics, manuscript received Aug. 24, 1992.

R. Welty, et al., "A Series Array of DC Squids," IEEE Transactions on Magnetics, vol. 27, No. 2, Mar. 1991, pp. 2924–2929.

N. Welker, et al., "A Superconductive H–Field Antenna System," Laboratory for Physical Sciences, College Park, Maryland, (journal unknown), (publ. date unknown) pp. 183–187.

S. Wolf, et al., "Superconducting Extremely Low Frequency (ELF) Magnetic Field Senors for Submarine Communications;" IEEE Trans. On Communicions, vol. Com–22, No. 4, Apr. 1974, pp. 549–554.

(List continued on next page.)

*Primary Examiner*—Gerard Strecker
*Attorney, Agent, or Firm*—John C. Hammar

[57] ABSTRACT

A magnetic field sensor which can be used as an active antenna is disclosed that is capable of small size, ultrawideband operation, and high efficiency. The sensor includes a multiplicity of magnetic field transducers, e.g., superconducting quantum interference devices (SQUIDs) or Mach-Zehnder modulators, that are electrically coupled in a serial array. Dummy SQUIDs may be used about the perimeter of the SQUID array, and electrically coupled to the active SQUIDs for eliminating edge effects that otherwise would occur because of the currents that flow within the SQUIDs. Either a magnetic flux transformer which collects the magnetic flux and distributes the flux to the transducers or a feedback assembly (bias circuit) or both may be used for increasing the sensitivity and linear dynamic range of the antenna.

5 Claims, 13 Drawing Sheets

OTHER PUBLICATIONS

J. Davis, et al., "Development of a Superconducting ELF Receiving Antenna," IEEE Trans. on Antennas and Propagation, vol. AP–25, No. 2, March 1977, pp. 223–231.

M. Nisenoff, "The Use of SQUIDS in Low–Frequency Comminication Systems," AIP Conf. Proc., vol. 44, 1978, pp. 117–129.

K. Stawiasz, et al., "Noise Measurements of Series SQUID Arrays" IEEE Trans. on Applied Superconductivity, vol. 3, No. 1, Mar. 1993, pp. 1808–1811.

R. Hansen, "Fundamental Limitations in Antennas," Proc. of the IEEE, vol. 69, No. 2, Feb. 1981, pp. 170–182.

R. Dinger, et al., "Adaptive Methods for Motion–Noise Compensation in Extremely Low Frequency Submarine Receiving Antennas," Proc. of the IEEE, vol. 64, No. 10, Oct. 1976, pp. 1504–1511.

ELECTRICALLY SMALL, WIDEBAND, HIGH DYNAMIC RANGE ANTENNA HAVING A SERIAL ARRAY OF OPTICAL MODULATORS

REFERENCE TO RELATED APPLICATIONS

The present application is a continuation-in-part application based upon U.S. patent application Ser. No. 08/469,393, filed Jun. 6, 1995, which was a continuation-in-part application based upon Ser. No. 08/313,506, filed Sep. 26, 1994, now U.S. Pat. No. 5,600,242.

TECHNICAL FIELD

The present invention relates to an electrically small, ultrawideband, high linear dynamic range active antenna, and to a method for improving the sensitivity of a dipole antenna.

BACKGROUND OF THE INVENTION

Conventional antennas primarily receive the electric field component of the electromagnetic radiation; the electric field component induces a voltage in the antenna which is amplified through resonance. A conventional antenna is referred to as "electrically small" if its size is less then one-quarter of the wavelength for which the antenna is tuned. Attempts to construct an efficient, electrically small, antenna have met with several obstacles.

Generally, conventional antennas (i.e., dipoles) have bandwidths of less than 20% of their resonant frequency for useful operation. Larger bandwidths can be obtained with "frequency independent" antennas (i.e., equiangular spirals), however, even they tend to have maximum bandwidths of about 10:1 (i.e., 2–18 GHz). In such spirals, the bandwidth is set by the size of the antenna being $\lambda/3$ at the lower end of the band and by the electrical size of the antenna feed on the high end of the band. In either case, the size of conventional antennas places at least a lower limit on the frequency of electromagnetic radiation that can efficiently be received. This limit is merged by the sensitivity wavelength correlation. Also, the size of an efficient, low frequency antenna can be prohibitively large for most platforms, so efficiency is often sacrificed to make them smaller. For example, a conventional $\phi_0$ dBi antenna for detecting 1 MHz signals would be 400 feet in diameter for optimal efficiency.

Another obstacle to constructing an electrically small antenna is that a reduction in the size of the antenna generally results in a corresponding reduction in its bandwidth because of the sensitivity: wavelength correlation. Electrically small antennas must be resonant to absorb power effectively and efficiently from the incident energy. Since electrically small antennas also have a small impedance as seen at the antenna feed, additional methods for achieving resonance will be narrow band.

Still another obstacle associated with conventional antenna systems is the limited linear dynamic range of any preamplifiers connected to the passive antenna. Typically semiconductor preamplifiers have about a 100 dB linear dynamic range in the power output of the amplified signals over a 1 Hz bandwidth. In many applications this dynamic range, along with the associated sideband level increase (due to nonlinearities), is unacceptable. Quite often linear dynamic range requirements of over 130 dB are required in a 1 Hz bandwidth.

Further, since the efficiency of conventional antennas is reduced with their size, noise and other inherent losses become more important when post-processing the antenna's received signal. Increased inefficiency for small antennas is an unavoidable consequence of the low radiation resistance compared to resistive losses of the antenna. Still further inefficiency for small antennas can result from an impedance mismatch between the antenna impedance and the feed line impedance which is typically 50 ohms.

Superdirectivity (i.e., supergain) principles introduce additional problems. Superdirectivity refers to the ability of an electrically small antenna to have the same antenna pattern as an electrically larger antenna. Superdirectivity is typically obtained by producing a phased array of closely spaced conventional antennas. For traditional phased arrays the spacing of the elements is typically less than one half wavelength at the highest operating frequency. The size of the antenna element will determine the phased array bandwidth. For superdirective arrays with even smaller inter-element spacing, the size of each antenna element becomes more important, because further reductions in the antenna efficiency arise from strong mutual coupling between the plurality of closely spaced antenna elements. Consequently, conventional superdirectivity (phased) arrays are inefficient and impractical.

Welker attempted to provide an electrically small, high bandwidth antenna using superconducting quantum interference devices (SQUIDs) as the preamplifier. Welker et al., "A Superconductive H-Field Antenna System," Laboratory for Physical Sciences, College Park, Md. FIG. 2 of the Welker article provides a schematic illustration of the manner in which the SQUID preamplifier is coupled to the antenna in an attempt to improve the bandwidth and sensitivity of an electrically small antenna, but this arrangement suffers from some of the same disadvantages of conventional antenna systems. For example, the pickup loop is inherently narrow band because of its size and method of construction (i.e., the use of resistors and capacitors). Furthermore, the Welker system uses a single inefficient RF biased SQUID which dictates using a much larger pickup loop and produces a reduced linear dynamic range.

Accordingly, it is desirable to provide a small antenna capable of wideband operation, especially an antenna that is efficient and has a large linear dynamic range. It is further desirable to provide an antenna that, instead of detecting the electric component of electromagnetic radiation, produces an output signal in response to the incident magnetic field component.

SUMMARY OF THE INVENTION

The present invention is an electrical or electro-optical sensor for detecting the magnetic component of the incident electromagnetic radiation including a plurality of interconnected magnetic field transducing elements (i.e., a phased array). The array is constructed to combine the electrical energy provided by each of the elements. The antenna also includes a bias circuit, coupled to the array, for providing a bias signal to the plurality of magnetic field transducing elements. The elements may be electrical devices, such as SQUIDs, or optical devices, such as Mach-Zehnder modulators. The bias signal effectively amplifies the magnitude of the signal change. The signal change arises (such as SQUIDs) from a phase shift caused by the applied magnetic field.

In one embodiment of the invention, tunnel junction elements are arranged in a multidimensional array. The antenna also includes a plurality of dummy tunnel junction elements electrically coupled to the active tunnel junction elements and positioned at the array perimeter. The dummy tunnel junction elements eliminate edge effects for the array to ensure that all the active tunnel junction elements receive substantially equal magnetic flux from the applied electromagnetic field.

In another embodiment of the invention, a magnetic flux transformer (focuser) collects the magnetic flux over a large area and distributes the flux to the plurality of magnetic field transducing elements to enhance linear dynamic range and sensitivity. A simple and compact feedback assembly is responsive to the plurality of magnetic field transducing elements for providing feedback to the magnetic flux transformer. The magnetic flux transformer is responsive to the feedback for maintaining the magnetic flux provided to the plurality of magnetic field transducing elements to achieve the desired enhancement to dynamic range. The result of these improvements is an electrically small, ultrawideband, high dynamic range sensor with high sensitivity and efficiency.

In an electro-optical embodiment, Mach-Zehnder interferometers replace the SQUIDs. A strip antenna coupled to a slot or pickup loop receives the signal and couples that signal to an optical carrier signal through a time delay waveguide, as is common with the Mach-Zehnder devices. The modulated optical signal is amplified with the series of interferrometers which each are driven with the influence of the field from the strip antenna. A photo detector reconnects the optical signal to RF for processing in accordance with the other RF embodiments. An electro-optical embodiment does not require cooling, but is physically larger than the RF embodiments.

The present invention also relates to a method for increasing the sensitivity of an electric dipole antenna, particularly a slot, by coupling the received signal from the slot to a serially connected SQUID array (or equivalent).

BRIEF DESCRIPTION OF THE DRAWINGS

The file of this patent contains at least one drawing executed in color. Copies of this patent with color drawing (s) will be provided by the Patent and Trademark Office upon request and payment of the necessary fee.

DETAILED DESCRIPTION OF THE INVENTION

The present invention is an active sensor for responding to the magnetic component of incident electromagnetic radiation. In accordance with the present invention, the sensor can be constructed to be extremely small (e.g., 4 mm×4 mm) and yet provide ultrawideband operation (i.e., DC to greater than 10 GHz). Furthermore, the sensor can be constructed to provide a high dynamic range (i.e., the maximum to minimum detectable magnetic field ratio of at least 124 dB for a less than −60 dB sideband level) and still maintain a high efficiency. These characteristics are obtained by constructing a sensor (i.e., an antenna) with a flux transformer or focuser for sensitivity enhancement along with an array of magnetic field transducers which by themselves can be used to increase sensitivity multiplicitively or to increase the linear dynamic range by distributing the applied magnetic flux over many SQUIDs. A negative magnetic flux feedback circuit, or low frequency filtering with magnetic shielding, can also be used to increase the linear dynamic range.

Figure 1:
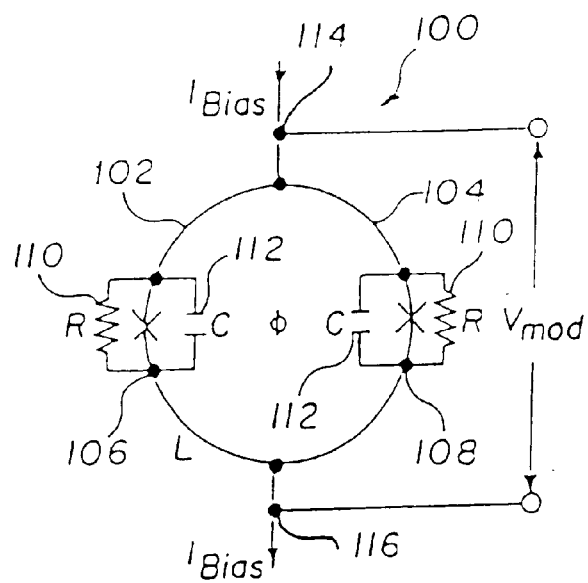
FIG. 1 shows a superconducting quantum interference device (SQUID) that is used as the magnetic field transducing element in a preferred RF embodiment to the present invention.

The magnetic field transducing element for RF operation is a device having Josephson tunnel-junctions such as a superconducting quantum interference device (SQUID). An example of a DC-SQUID 100 is illustrated in FIG. 1 which includes first and second DC current paths 102 and 104, each having a respective Josephson tunnel-junction 106 and 108. As is conventional in the art, each Josephson tunnel-junction is illustrated schematically as including a resistance 110 and a capacitance 112. The sensor of the present invention overcomes the shortcomings of conventional antennas to provide a small, wideband, high dynamic range antenna. Moreover, the sensors can be used for many other magnetic or electric field sensing applications.

In FIG. 1, the SQUID 100 is DC current biased, i.e., to receive a constant current $I_{bias}$ at its input 114. DC SQUID devices are constructed so that they conduct current that includes a superconducting current component as well as a normal current component. With reference to the DC SQUID 100, in the absence of an applied magnetic field, the superconducting current component that is conducted in path 102 will be in phase with the superconducting current component that is conducted in path 104. In the presence of an applied magnetic field φ, the relative phase of the superconducting current component conducted in paths 102 and 104 will be altered, thereby changing the manner in which the superconducting current components are combined at the output node 116 of the DC SQUID 100. Since the total current conducted through the DC SQUID 100 is constant, the change in the manner that the superconducting current components are combined will be compensated by a respective complementary change in the magnitude of the normal current component. The increase or decrease in the magnitude of the normal current component will provide a modulated output voltage ($V_{mod}$) that will be indicative of the applied magnetic field. This relationship is illustrated in the performance graphs 118 and 120 of FIG. 2.

Figure 2:
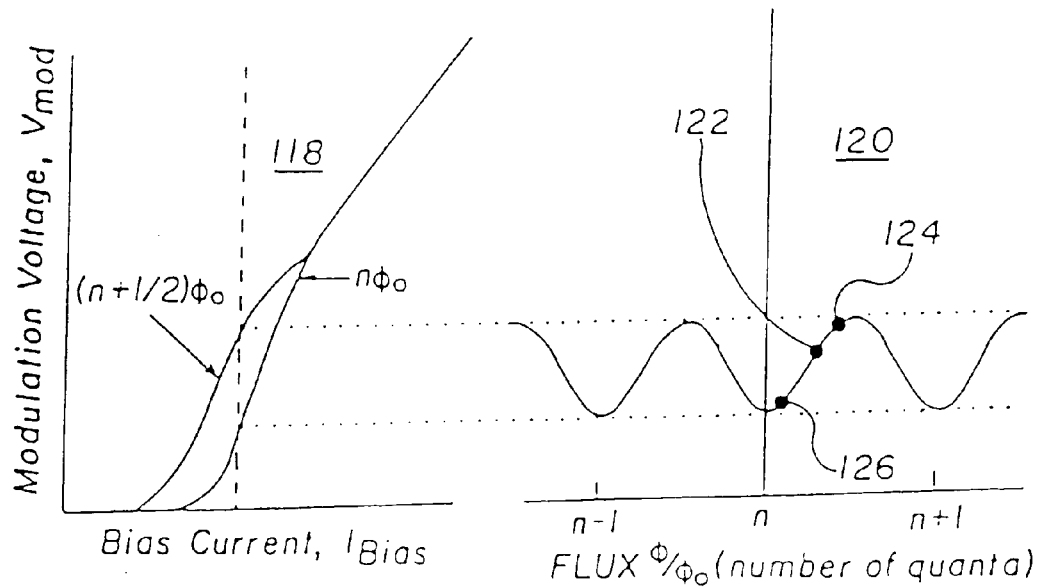
FIG. 2 illustrates the voltage versus current and voltage versus flux relationships for the SQUID illustrated in FIG. 1.

Referring to FIG. 2, graph 118 represents the relationship between the modulation voltage and the bias current for two applied magnetic flux levels, i.e., $n\phi_0$ and $(n+\frac{1}{2})\phi_0$, where $\phi_0$ is a standard unit equal to $2.07 \times 10^{-15}$ Webers. The curve on graph 118 for the applied flux $(n+\frac{1}{2})\phi_0$ represents a phase difference between the superconducting current components in paths 102 and 104 of $\pm 180°$. The phase difference between the superconducting current components in paths 102 and 104 of the curve for the applied flux $n\phi_0$ is 0° or $\pm 360°$ as a result, when a constant bias current is applied, the output voltage is a periodic voltage that varies with changes in the applied magnetic flux, as shown in graph 120 of FIG. 2. In graph 120, the applied magnetic flux $\phi$ has been normalized by dividing by the standard unit $\phi_0$. The applied flux is referred to as integral multiples of the normalized flux, i.e., $\phi=n(\phi/\phi_0)$. Graphs 118 and 120 thus illustrate that the output voltage of the DC SQUID 100 is periodic for constant bias current and varying applied flux.

SQUIDs with flux transformers (focusers) are more sensitive. Conventional SQUIDs are typically small or inefficient and are typically used for measuring levels between $10^{-5}$ and $10^{-9}$ Gauss. For antenna operation, even greater sensitivity to electromagnetic fields is required. Since the ambient magnetic noise floor can be as low as $10^{-13}$ Gauss, sensitivities on the order of at least $2\times10^{-13}$ gauss, are desirable. Accordingly, for antenna operation, it is necessary to improve the sensitivity of the SQUIDs.

Figure 3:
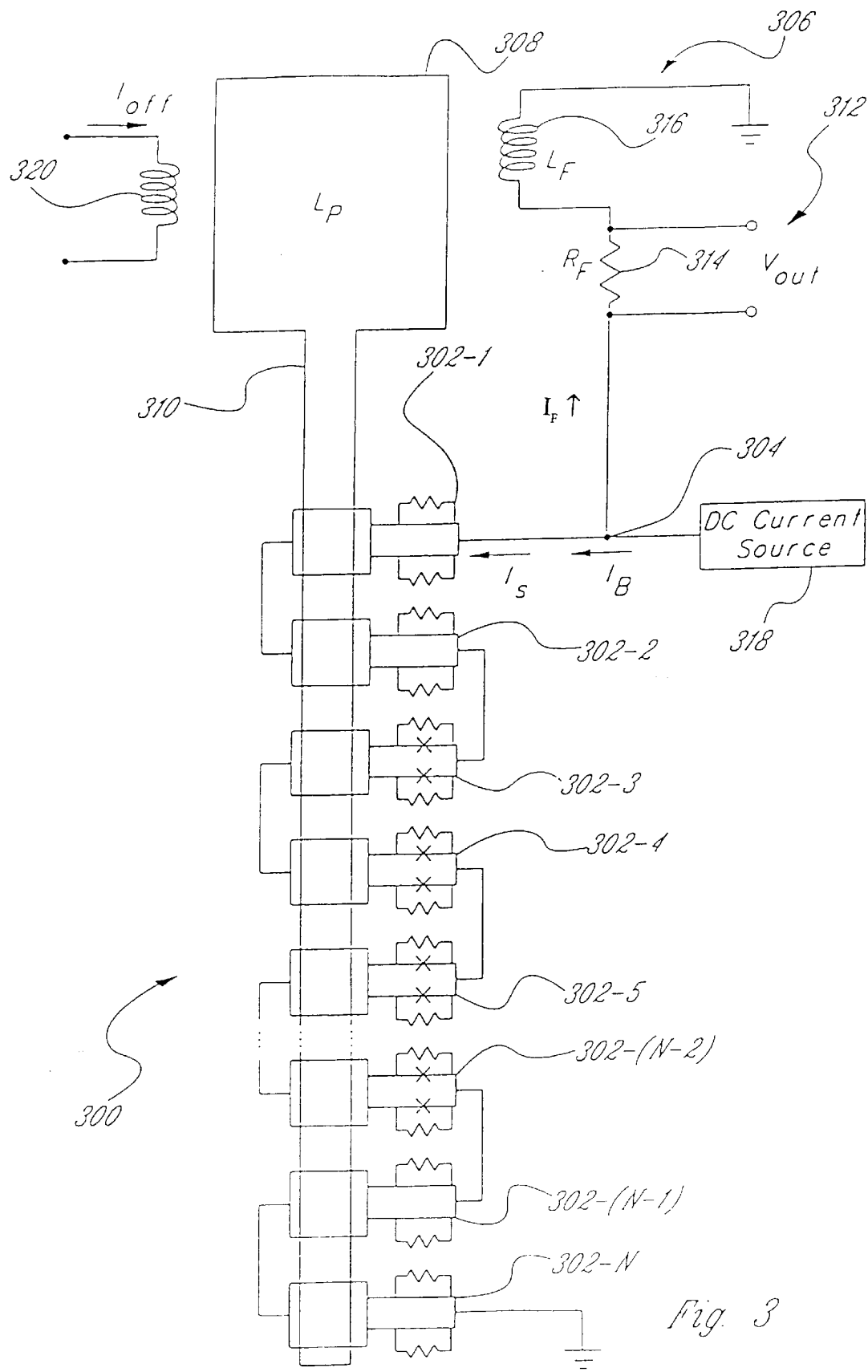
FIG. 3 shows an antenna array of the present invention including a feedback assembly.

To achieve this sensitivity, a sensor 300 in FIG. 3 includes a plurality of SQUIDs 302-1 through 302-N that are coupled in a serial array to receive DC current from an input node 304. "Dummy" SQUID elements 302-1, 302-2, 302-(N-1) and 302-N have the same metal geometry as the "active" SQUIDs 302-3 through 302-(N-2) but do not have tunnel junctions. Although two dummy elements are shown on each end, the number can vary. A magnetic flux collecting assembly 306 includes a large area coil 308 electrically coupled to a small area coil 310. The small area coil is inductively coupled to the plurality of SQUIDs 302-1 and 302-N.

The magnetic flux collecting assembly 306 acts as a flux focuser to collect incident magnetic flux and focus the flux upon the SQUIDs 302-1 through 302-N. In the embodiment illustrated in FIG. 3, the small area coil 310 is configured in a loop with the SQUIDs connected to the loop in a line. The small area coil may be constructed in a variety of configurations for inductive coupling with the SQUIDs.

The large area coil 308 (which is not shown to scale in FIG. 3) collects the magnetic flux and feeds the flux to the SQUIDs 302-3 through 302-N-2. To improve the sensitivity of the sensor 300 and to increase the flux collection area, the coil 308 is constructed of a substantially large area in comparison to the area of the small area coil 310. The combination of the large area coil and the small area coil performs the function of a magnetic flux transformer, i.e., transforming the magnetic flux collected over the large area of the large area coil 308 to the smaller area of the small area coil. In a sense, the large area coil functions as a lens to concentrate the magnetic field on the small area coil 310. Many alternative configurations for the flux collection assembly 306 will readily become apparent to those skilled in the art. For example, the large area coil 308 could be multiple coils connected in parallel to the terminals of the small area coil 310, to form a fractional turn coil. As another example, resistors and/or capacitors could be connected in series with the large area coil 308 for filtering the feedback flux.

The sensor 300 also includes a feedback assembly 312 that is electrically coupled to the SQUIDs 302-1 through 302-N at the input node 304. The feedback assembly 312 further includes a resistor 314 coupled to the input node 304 in parallel with SQUIDs 302-1 to 302-N. The second lead of the resistor 314 is coupled to ground through an inductor 316. The inductor 316 is inductively coupled to the large area coil 308 to provide feedback to the magnetic flux collecting assembly 306. A current source 318 is constructed to provide a constant current $I_B$ to the input node 304. Accordingly, the feedback assembly 312 is responsive to the SQUIDs 302-1 through 302-N with variations in current $I_S$ for providing magnetic flux feedback to the large area coil 308 thereby to reduce the magnetic flux provided to the small area coil 310 and, hence, reduce the number of SQUIDs 302-1 through 302-N that are required for a high linear dynamic range. Alternatively, the feedback magnetic flux could also be inductively coupled directly to the small area coil 310 to maintain the total flux at a predetermined level.

Figure 3A:
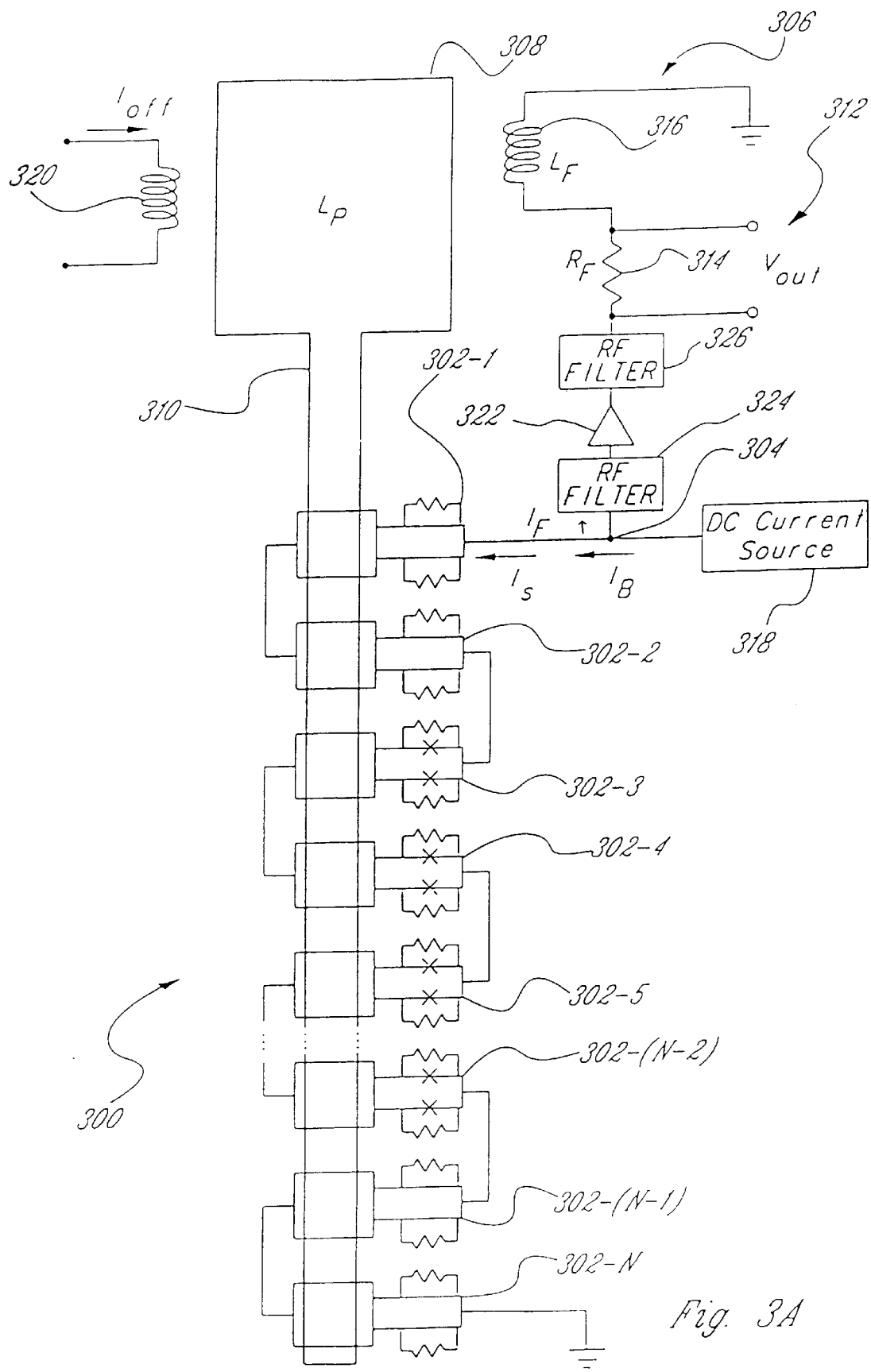
FIG. 3A is an alternative embodiment of the antenna illustrated in FIG. 3.

As still another alternative for increasing the linear dynamic range of the sensor 300, an amplifier 322 can be coupled in series with first and second RF filters 324 and 326, respectively, and the combination coupled in series with the input node 304 and the resistor 314, as illustrated in FIG. 3A. The alternative embodiment of FIG. 3A can also be used with direct inductive coupling to the small area coil 308. Preferably, the amplifier 322 is a low noise amplifier. The amplifier 322 enhances the gain of the feedback assembly 312, thereby increasing the dynamic range of the sensor 300. The RF filters may be either high pass or low pass and are provided for eliminating undesirable frequencies that may induce instability in the feedback circuit.

An inductor 320 is coupled to a constant current source to provide a biasing magnetic flux induced with current $I_{OFF}$ to the large area coil 308. More particularly, with reference to graph 120 of FIG. 2, the inductor 320 is constructed to provide adequate magnetic flux to the large area coil 308 so that in the absence of an applied magnetic field $\phi$, each SQUID 302-3 through 302-(N-2) will be operating at voltage flux position 122. The gain of a negative feedback assembly 312 is preferably constructed so that the SQUIDs will operate within the active range of the voltage versus flux characteristics illustrated in FIG. 2 between a maximum output voltage indicated at point 124 and a minimum output voltage indicated at point 126.

As illustrated in FIG. 3, the output voltage $V_{out}$ of the antenna is measured as the voltage associated with current $I_F$ across the resistor 314 although the voltage could also be measured across the resistor 314 and inductor 316. Alternatively, the output voltage can be measured across the plurality of SQUIDs 302-1 through 302-N, e.g., from the input node 304 to ground. The advantage of the alternative configuration is that the feedback assembly 312 is required to work over a lower frequency range. Phase delays are not a problem.

Figure 4:
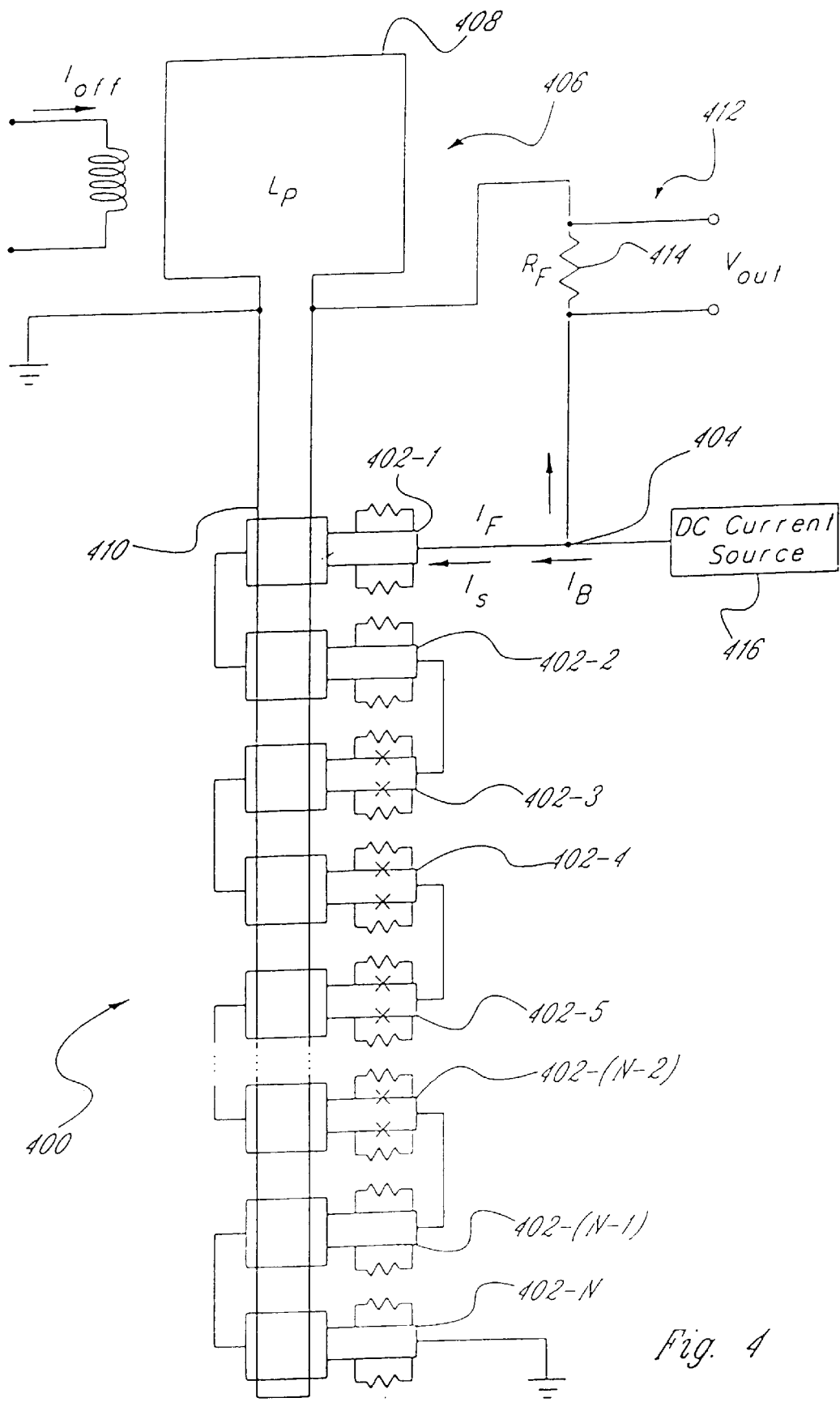
FIG. 4 shows an alternative embodiment of the feedback assembly of FIG. 3.

An alternative embodiment of the sensor is illustrated in FIG. 4. A sensor 400 includes SQUIDs 402-1 through 402-N that are serially coupled between an input node 404 and ground. At least the first two and at least the last two devices should be "dummy" SQUIDs which do not have tunnel junctions. A flux collecting assembly 406 includes a large area coil 408 electrically coupled to a small area coil 410 wherein the small area coil 410 is inductively coupled to the SQUIDs 402-1 through 402-N.

A feedback assembly 412 is also provided and coupled to the SQUID 402-1 through 402-N at the input node 404. Like the feedback assembly 312 illustrated in FIG. 3, the feedback assembly 412 is constructed to minimize the variation in the magnetic flux provided to the small area coil 410 thereby to increase the overall linear dynamic range of SQUIDs 402-3 through 402-(N-2). Unlike feedback assembly 312, the feedback assembly 412 is not constructed to provide magnetic flux to the large area coil 408. Instead, the feedback assembly 412 includes a resistor 414 having a first lead coupled to the input node 404 and a second lead electrically coupled to the small area coil 410 for providing electrical energy, e.g., current, to the small area coil. DC current source 416 provides a constant current to the input node 404 so that modulation in the voltage at the node 404, relative to ground, will provide a similar modulation in the feedback current $I_F$, which is measured as the voltage drop across the resistor 414 to provide the output of the sensor 400. The output of the sensor 400 can also be measured across the SQUIDs 402-1 through 402-N.

As discussed above by reference to the sensor 300 of FIG. 3, the large area coil 408 could be constructed from multiple coils and can be used in combination with filtering resistors and capacitors. Further, as discussed by reference to FIG. 3A, a serial combination of an amplifier with RF filter can be coupled in series with input node 404 and the resistor 414 to improve the gain of the feedback assembly 412, thereby increasing the dynamic range of the sensor 400.

The advantage of the antennas 300 and 400 is that the sensitivity of the sensor is improved well beyond that typically available for single DC SQUID devices. The array permits a larger dynamic range for the sensors 300 and 400 than would be available with a single SQUID. Also, the feedback circuit enhances the linear dynamic range of the sensor. Although the sensors 300 and 400 illustrated in FIGS. 3 and 4 have eight SQUIDs, to improve the overall dynamic range of the sensor, 100, 1000, or more SQUIDs may be used. Low frequency (i.e., <1 MHz) or high frequency (i.e., >1 MHz) feedback depends on the values and configuration of the resistors and the inductor.

Figure 5:
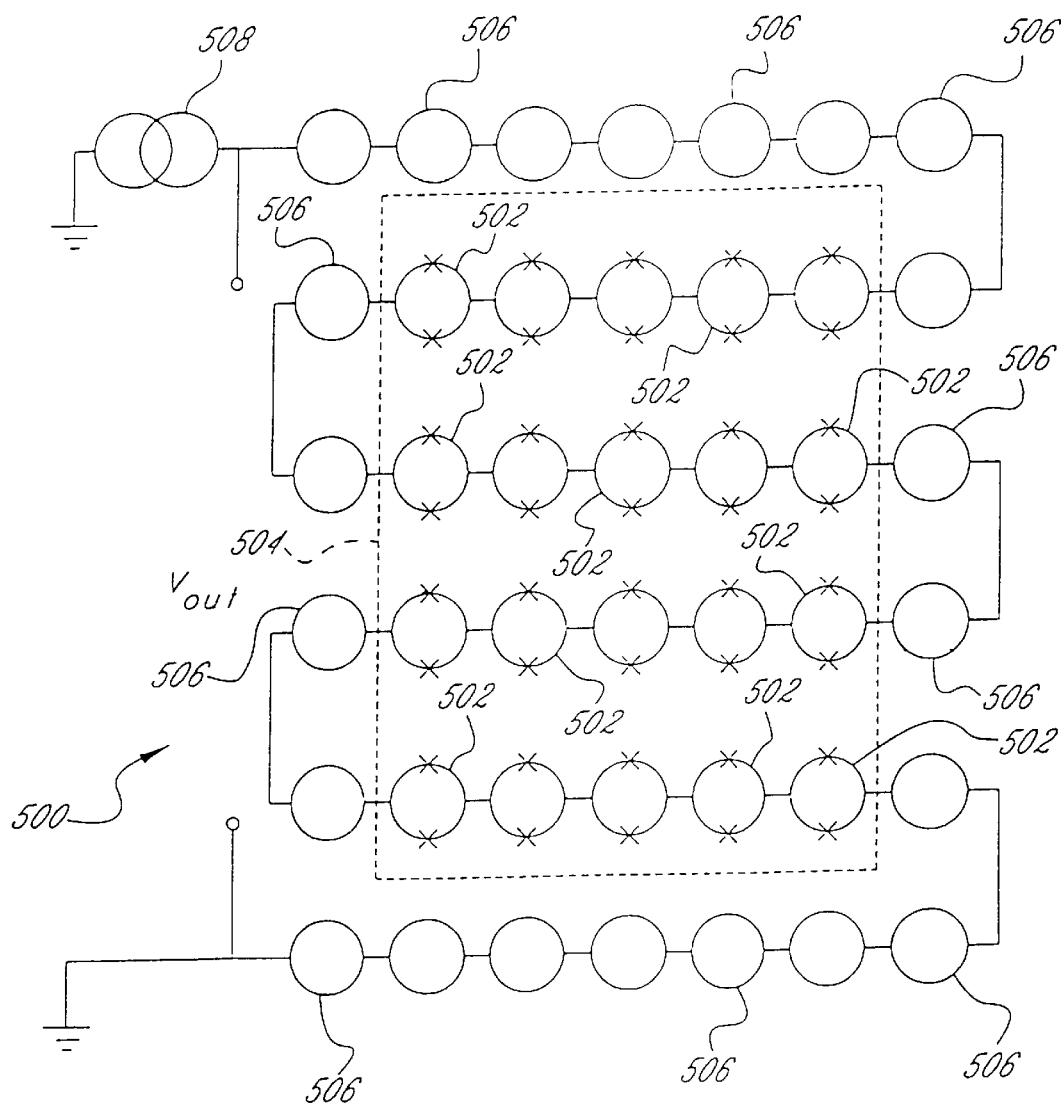
FIG. 5 is a schematic diagram of an array of the present invention using a plurality of SQUIDs.

Another alternative embodiment of the invention is illustrated in FIG. 5. Sensor 500 is constructed from a plurality of serially coupled SQUIDs 502 positioned in an array defining a perimeter 504. Although the array illustrated in FIG. 5 is a two-dimensional array, the invention can be constructed with a linear array or a multidimensional array, i.e., two-dimensional array, three-dimensional array, etc. The output voltage of the sensor $V_{out}$ is measured across the SQUIDs, which increase the area over which the applied magnetic field is detected, thereby increasing the sensitivity and the linear dynamic range of the sensor.

To insure maximum output voltage, $V_{out}$, from the 2-dimensional SQUID array, SQUIDs 502 close to the perimeter 504 must behave in the same manner as the SQUIDs that are in the interior of the array. Since the SQUIDs conduct currents, they produce small electromagnetic fields. The interior SQUIDs would be subjected to a different electromagnetic environment than the SQUIDs close to the perimeter, but a plurality of dummy SQUID devices 506 are electrically coupled to SQUIDs 502 and positioned about the perimeter to reduce edge effects. All the active SQUIDs are affected by surrounding devices in which small currents are creating small magnetic fields so they all have similar background environments. The dummy SQUID devices 506 are constructed to produce electromagnetic fields. The electrical output of the dummy SQUID devices is constant and independent of changes in the applied magnetic flux because the "dummies" replace the tunnel junctions with short circuits. Accordingly, the SQUIDs 502 function as though they were constructed in an infinite array, and therefore produce a maximum output voltage. The precise number of dummy elements and their location depends upon the geometry of the array which determines the nonuniform magnetic field distribution over the array without dummy elements. The number of active SQUIDs is determined by the desired flux to voltage transfer characteristics, linear dynamic range, and output noise impedance for the array.

A current source 508 is coupled to provide a constant current to the serial array of SQUIDs 502 and dummy SQUID devices 506. In the embodiment, the voltage generated by SQUIDs 502 comprises the output of the sensor 500.

Figure 6:
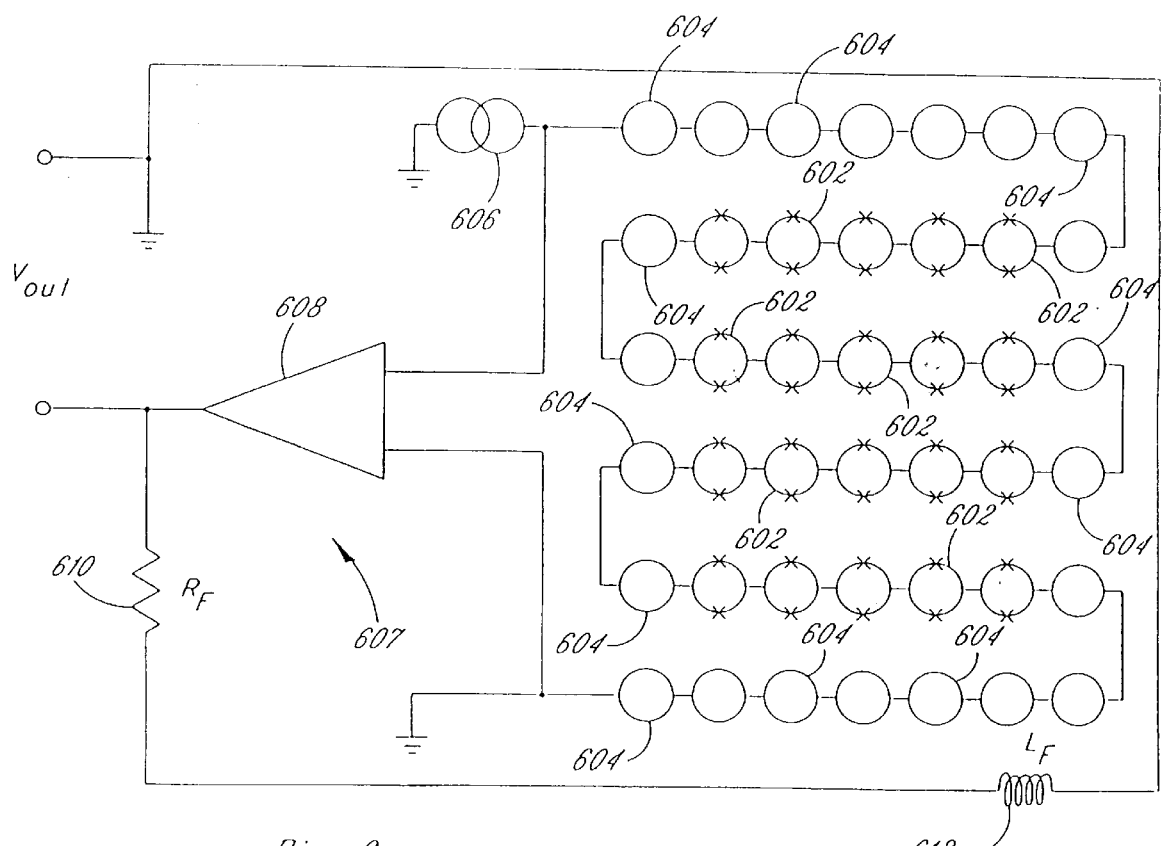
FIG. 6 is a schematic diagram, similar to FIG. 5, of an array of SQUIDs and an amplifier in series with an inductor and resistor to produce negative magnetic flux feedback.

FIG. 6 is an illustration of still another embodiment of the present invention. With reference to FIG. 6, a plurality of SQUIDs 602 are constructed in a serial array and include a plurality of dummy SQUID devices 604 positioned about the periphery of the array. A current source 606 is constructed to provide a source of substantially constant current to the SQUIDs 602.

A negative feedback circuit 607 at the output of the serial array amplifies the output voltage of the serial array. This feedback circuit reduces the need to add SQUIDs to increase the linear dynamic range. The feedback circuit 607 includes an amplifier 608 having its inputs coupled to the input and output of the serial array of SQUIDs 602. The output of the amplifier is coupled to ground through a resistor 610 and an inductor 612. The output of the sensor is measured across the resistor and inductor combination.

Figure 7:
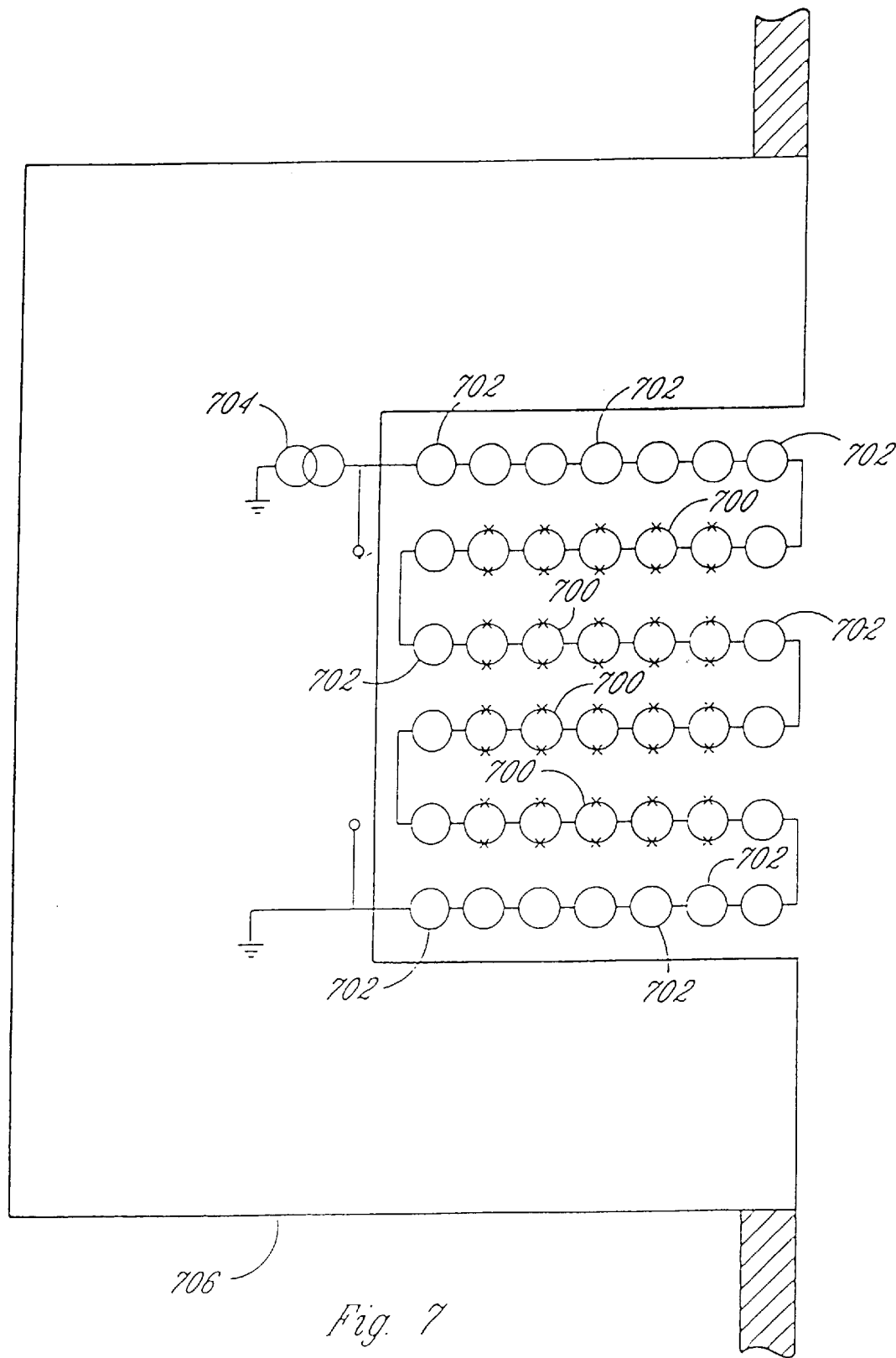
FIG. 7 is a schematic diagram of an alternative embodiment of the present invention showing and array of SQUIDs, similar to FIG. 5, in a ferromagnetic shielded box.

Still another embodiment of the invention is illustrated in FIG. 7. There, a serial array of SQUIDs 700 includes a plurality of dummy SQUID devices 702 positioned about the periphery. A current source 704 is coupled to provide a source of constant current to the SQUIDs. A magnetic shield 706 encloses the array for suppressing low frequency electromagnetic fields such as the earth's geomagnetic field, thereby substantially reducing or even eliminating the need for a feedback circuit. The shield allows induced surface circuits on the box to be coupled to the array through, for example, a conducting ribbon which is nonmagnetic. A slice in the ribbon would allow the DC SQUID array chip to be placed near the surface of the box but not too close as to be influenced directly by the earth's magnetic field. Configurations other than the conducting ribbon could be used to couple induced currents to the array without departing from the spirit of the invention. As mentioned before, the primary advantage of this approach is the reduced need for a negative flux feedback circuit. Also, although the conducting ribbon is shown coupled directly to the SQUID array in FIG. 7, it could be coupled to the array through a large area coil of a flux transformer in the same manner as the collected flux is coupled to the plurality of SQUIDs in the sensor 300 of FIG. 3.

The sensor can be miniaturized, even if it contains a large number of elements, and be only the size of an IC chip. At this size, the sensor will still have wideband performance with high linear dynamic range. Being small (i.e., 4 mm×4 mm) makes cooling of the sensor somewhat easier. The sensor occupies a small space and has a small thermal mass.

It is a solid state device so that it is easier to cool by cooling the substrate on which the elements are fabricated with a cryogenic cooling fluid. Because of its small size, the sensor might be immersed in the cryogenic fluid in a dewer taking into account the need for electrical isolation from the fluid.

Those skilled in the art will appreciate that although the sensors illustrated in FIGS. 3–7 have been shown and described by reference to DC SQUID devices, any Josephson tunnel-junction type device could be substituted without departing from the true scope of the invention. Moreover, other transducers for providing electrical energy indicative of an applied magnetic field could be substituted for the DC SQUIDs.

The superconductors used in the SQUIDs may be of any low or high temperature type. For example, a good low temperature superconducting material is Niobium or its alloys which are superconducting at liquid helium temperatures of about 4.2° K. A good high temperature superconducting material is a YaBaCuO(1-2-3) ceramic superconductor which is superconducting at liquid nitrogen temperatures of about 77° K. Similarly, the Josephson tunnel-junction used may be of any variety, however, superconductor/insulator/superconductor (SIS) or superconductor/normal metal/superconductor (SMS) junctions are appropriate, along with constriction-type junctions known as weak links.

Cooling of the elements is provided by conventional means and has not been illustrated to simplify the figures and discussion.

The performance of prototype SQUID sensors verified the desired characteristics. As one example, a 100-element SQUID sensor was constructed with a DC current bias source similar to that illustrated in FIG. 4. Instead of a flux focuser constructed like the large area coil 408 of FIG. 4, a fractional turn coil was used. A low-frequency signal source was used in combination with a Helmholtz coil for exciting the test sensor. The output from the sensor was compared with the input to the Helmholtz coil to determine a transfer function for the sensor. The transfer function was determined to be $1.2 \times 10^4$ V/T, which gives a minimum detectable magnetic field of $3.10 \times 10^{-14}$ T, comparable to the predicted minimum detectable field for the test sensor of $3.34 \times 10^{-14}$ T. Using an improved flux focuser would improve the predicted sensitivity, which was limited by the noise floor created by atmospheric and galactic radiation (magnetic fields).

Figure 8A:
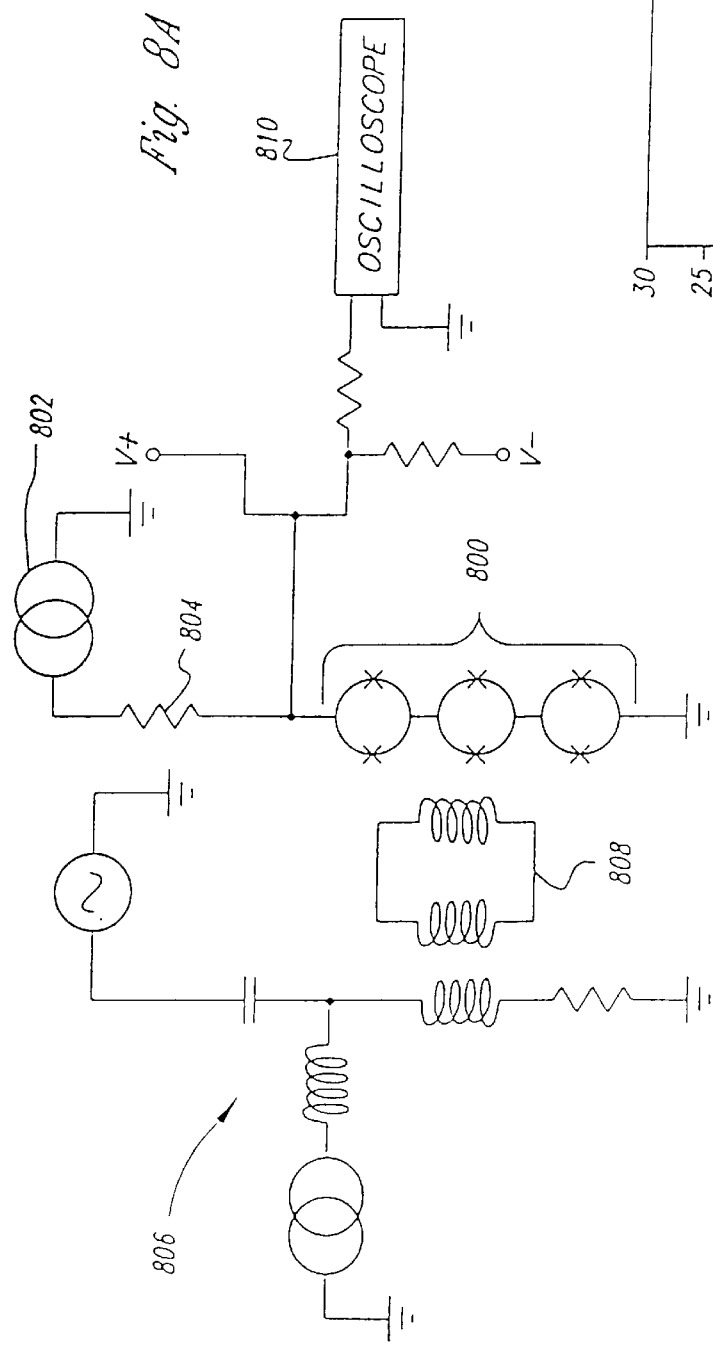
FIG. 8A is a schematic of a sensor used to gather test data to demonstrate the performance of the antenna of the present invention.
Figure 8B:
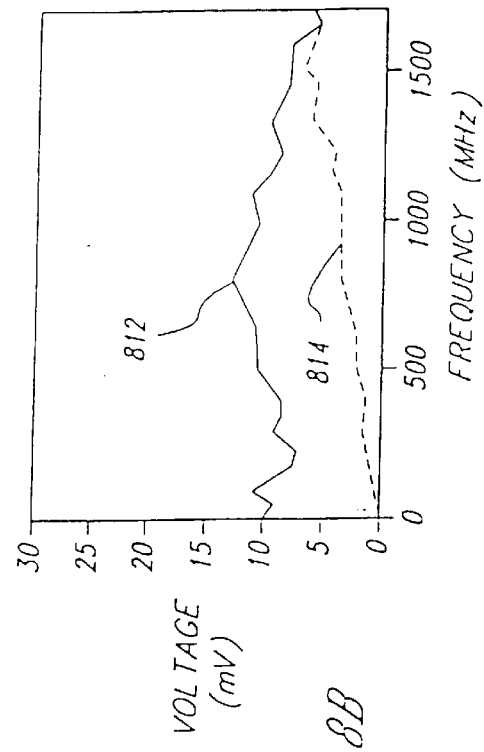
FIG. 8B is a graph showing the relationship of voltage to frequency measured with the test sensor of FIG. 8A.

In another test a 100-element SQUID array 800 (FIG. 8A) having a DC current bias provided by a direct current source 802 and a resistor 804 was constructed. The SQUID array was excited using an RF signal input 806 coupled to the SQUID array by a flux transformer 808. The output of the sensor was monitored using an oscilloscope 810. The results of the test are shown in FIG. 8B wherein the output from the SQUID sensor is illustrated by the solid graph 812 and the output without the SQUID array operating is illustrated by the dashed graph 814. This test setup provided nearly uniform output voltage for a bandwidth from DC to approximately 1 GHz before the output degraded appreciably. This test confirmed that the sensors have a bandwidth far better than that available with prior art antennas. The geometric configuration of the SQUID array probably contributed to induced EMF currents that caused degradation in the output voltage above 1 GHz. Accordingly, by properly selecting the geometric configuration of the array, the bandwidth can be further improved.

Figure 9:
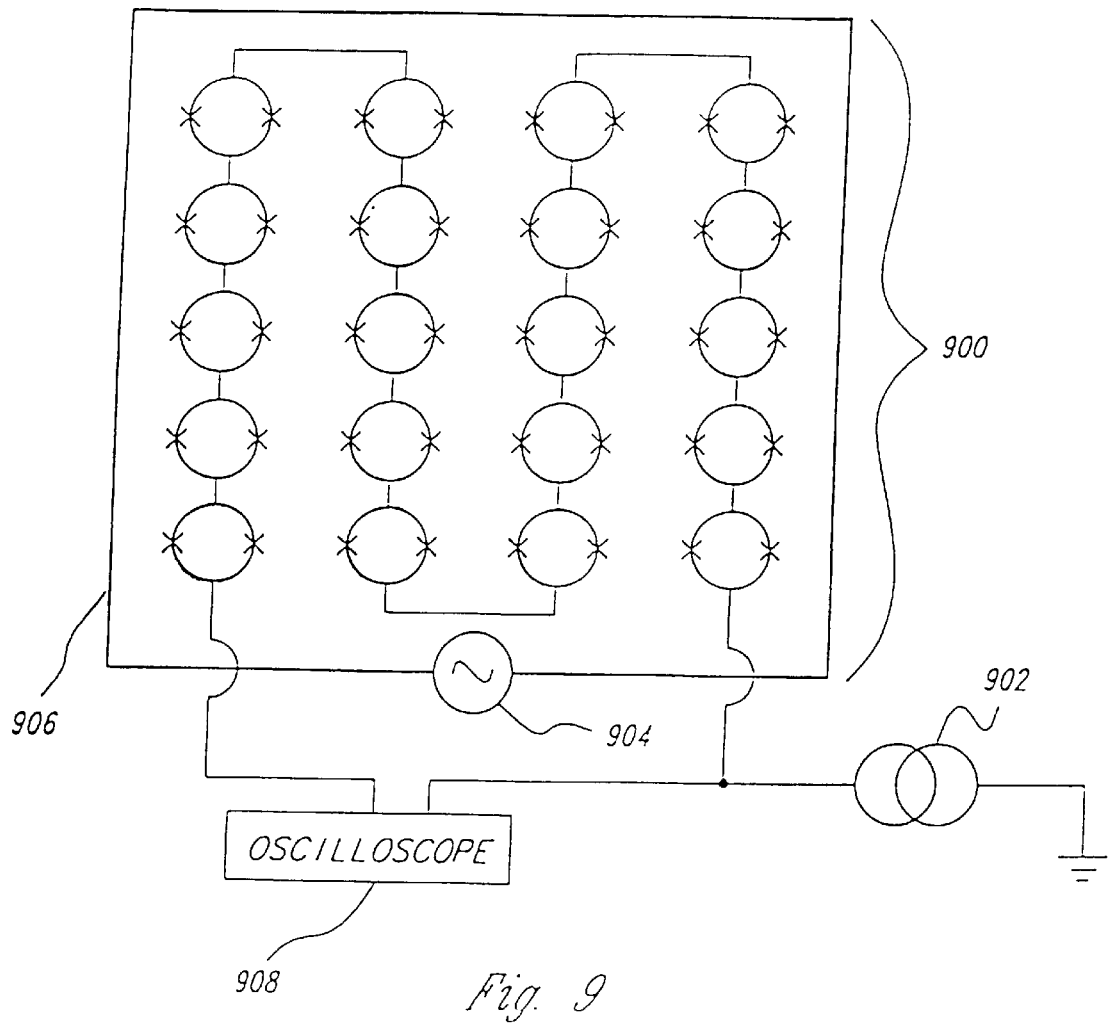
FIG. 9 is a schematic of an alternative sensor used to gather test data.

A 7,469-element SQUID array 900 was constructed with a DC source 902 as illustrated in FIG. 9. The SQUID array 900 was configured as a generally square, two-dimensional, n×k array, i.e., wherein n≅k. The array was excited using an input signal source 904 and a peripheral coil 906. The input and output voltages were measured using an oscilloscope 908. The measurements were analyzed to determine the linear dynamic range of the array in comparison to a single device. The test data showed that the output voltage-to-noise floor ratio was $3.4 \times 10^4$ for a single SQUID while the ratio for the 7,469-element array was $1.53 \times 10^8$. Thus, the additional SQUIDs increased the linear dynamic range by about $10^4$. This test confirmed that the linear dynamic range of the sensor can be improved by increasing the number of SQUIDs used in the sensor.

Figure 14:
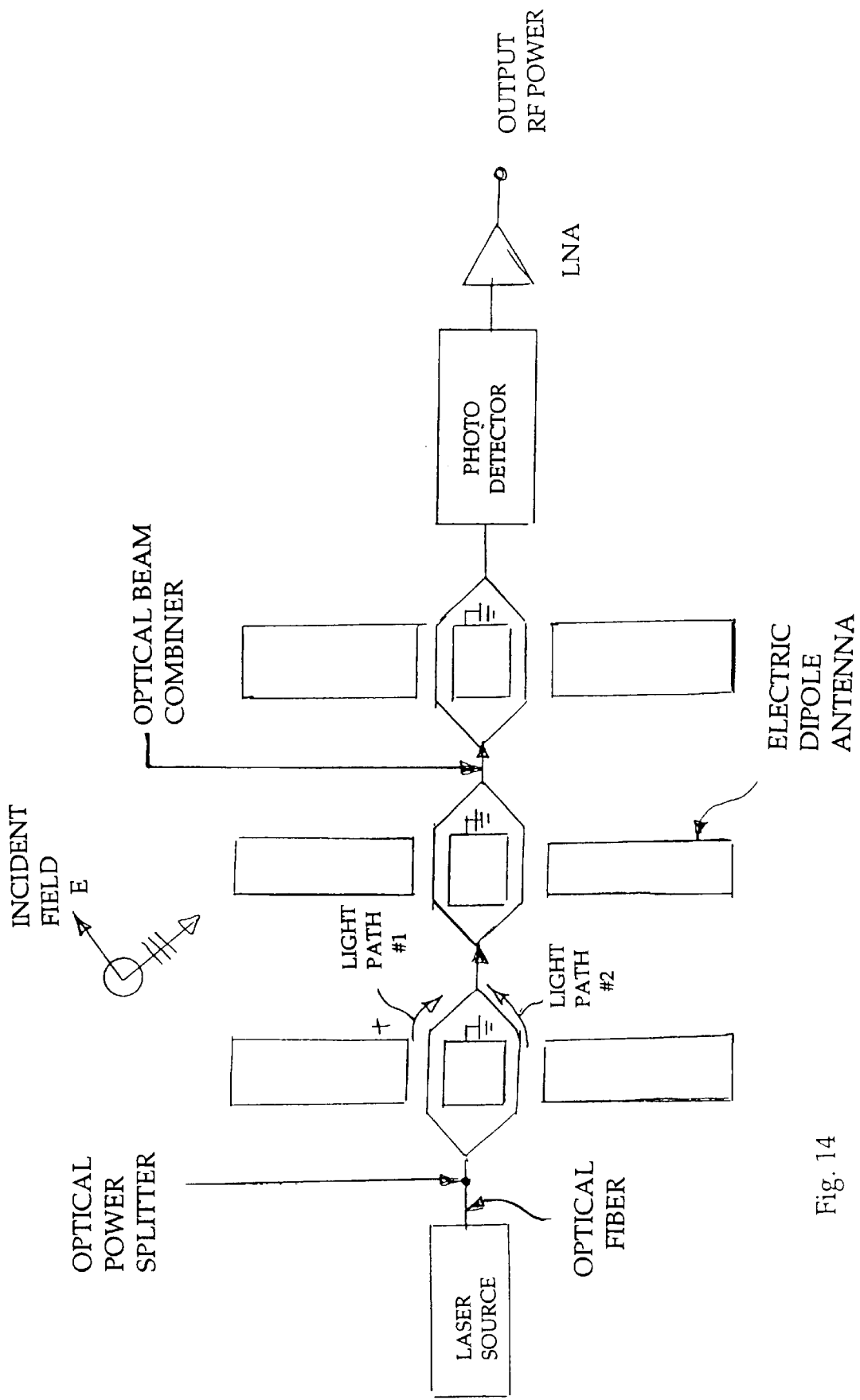
FIG. 14 is a preferred optical embodiment of the antenna.

An electric field version of the sensor can also be constructed, as previously described, with optical elements, such as Mach-Zehnder modulators, or FETs. In an embodiment, the interferometers (FIG. 14) or the FETs replace the SQUID devices. Dummy SQUID devices are unnecessary for the optical embodiment. A laser source feeds a carrier signal to a fiber that passes through the interferometers to connect them in series. The fiber ends in an optical-to-electrical transducer (i.e., a photovoltaic cell) to produce an RF signal for further processing. As illustrated in FIG. 14, the incident signal couples directly to dipole strip antennas that modulate the optical signal in $LiNbO_3$ waveguides associated with the interferometers. As described in U.S. Pat. No. 5,373,383 by LaGasse entitled "Optical Carrier Filtering for Signal/Noise and Dynamic Range improvement" (which we incorporate by reference), the sensitivity of an optical network of Mach-Zehnder modulators is improved by selectively filtering the modulated optical signal as a function of frequency. The modulator creates upper and lower sidebands of the optical carrier frequency when affected by an applied RF input. The SNR is improved by passing the modulated light signal that exits the modulator through an integrated optical filter. The filter removes most of the light at the carrier frequency without affecting the power in the sidebands to produce a modulated signal of acceptable average power for optoelectronic conversion to an RF signal through a suitable optical detector, such as an avalanche photodiode. The optical filter is a commercially available imbalanced interferometer.

Additional details of the construction and performance of Mach-Zehnder modulators (also sometimes called "interferometers") is provided in U.S. Pat. Nos. 4,814,706; 4,904,940; and 4,906,929, which we incorporate by reference. In these patents, Rempt focused upon measuring the derivatives of the applied magnetic field to discriminate targets, such as a convoy of trucks. The operation of the optical elements in response to an applied magnetic field is analogous to the receiving function of the present invention, although subsequent processing of the received signal may differ. The sensors of the present invention might only include two of Rempt's three cylinders because of the different purpose and function of the present sensor. Rempt discusses a magnetic bias field of the type we recommend to discriminate the signal from the natural background.

Figure 10:
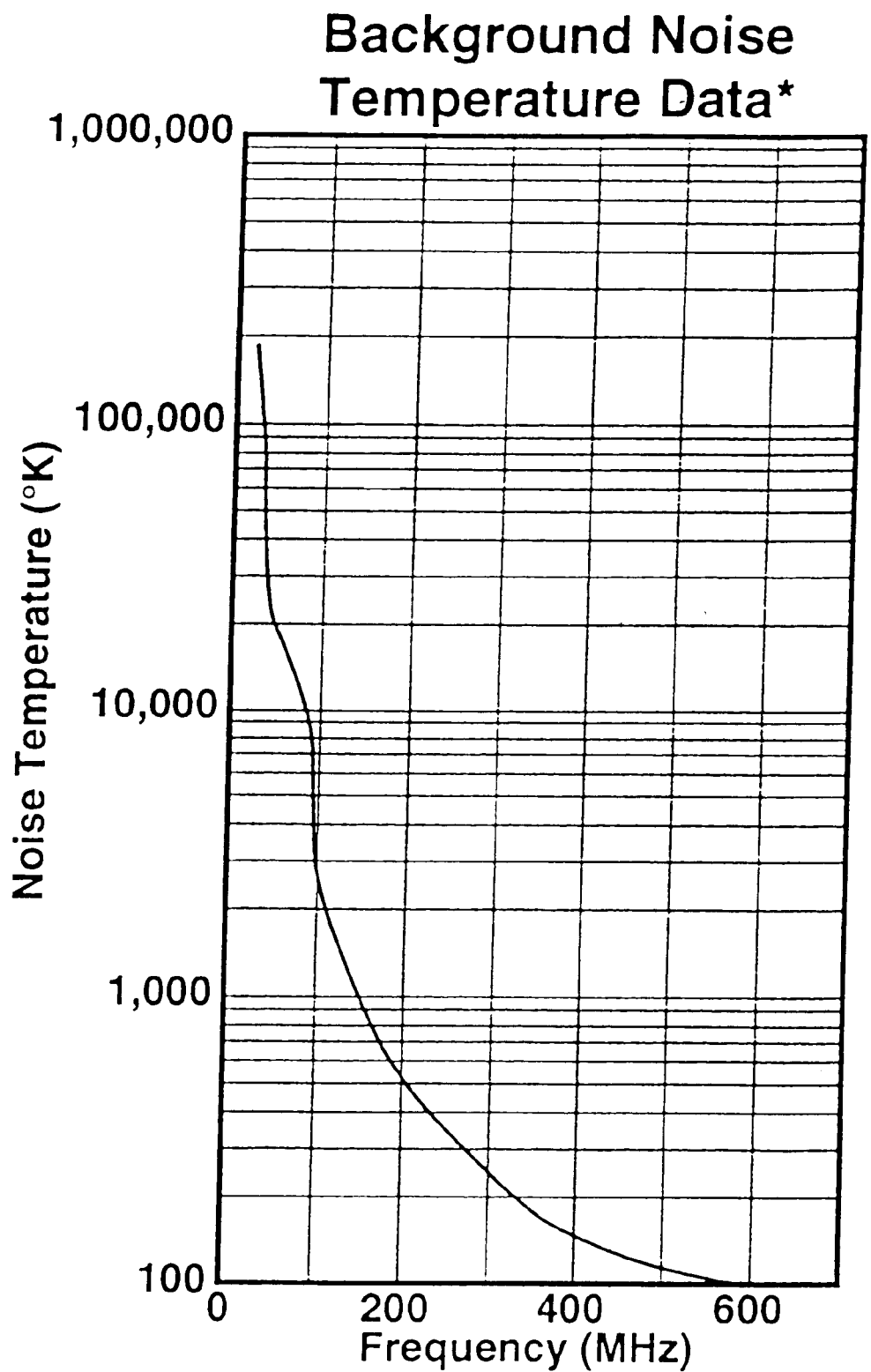
FIG. 10 is a graph showing background noise temperature data as a function of frequency.
Figure 11:
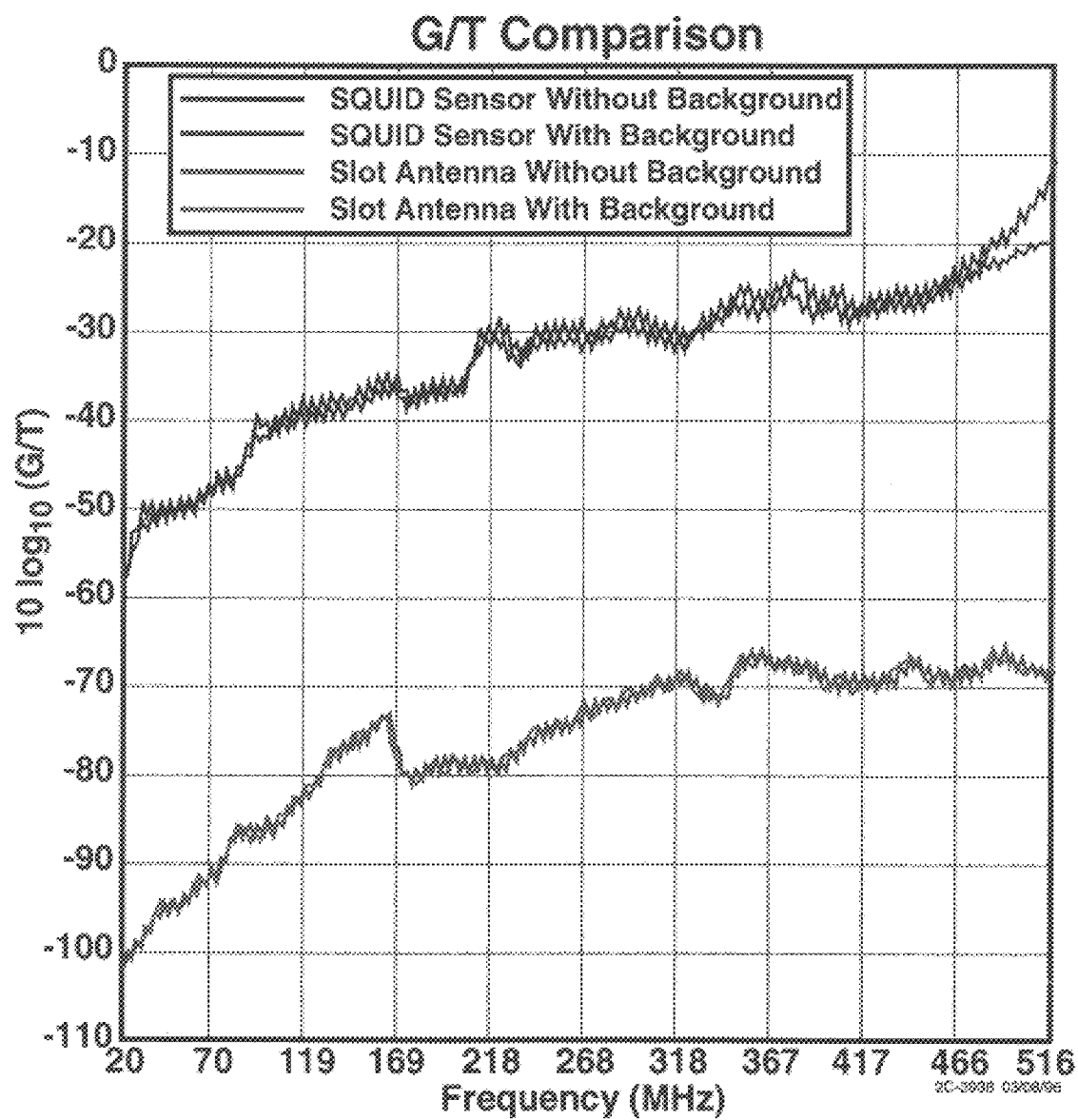
FIG. 11 is a graph comparing the antenna gain (G) to noise temperature (T) [G/T] as a function of frequency, for SQUID sensors of the present invention in comparison with conventional slot antennas of comparable size.

FIG. 11 shows the antenna gain to noise floor (G/T) comparison as a function of frequency between a SQUID antenna of the present invention and a conventional (passive) slot antenna of comparable size. For both the SQUID antenna and the slot antenna, we have plotted performance using the device noise temperature only and using the sum of the device noise temperature as measured at the transmission line output. The comparison of G/T is a meaningful way to assess the sensitivity of the two devices. FIG. 10 graphs the background noise temperature profile for a horizon pointing antenna, as published by M. SKOLNICK, RADAR HANDBOOK p. 2.29 or S. LEE, ANTENNA HANDBOOK, p. 6–25. FIG. 11 shows a significant improvement in the gain to noise floor for the SQUID antenna of the present invention. Generally, for the entire frequency band from 20–516 MHz, the SQUID antenna is 40–50 dB superior to the conventional slot antenna. For the SQUID antenna, the device noise temperature dominates except near 500 MHz where the large gain of the SQUID antenna starts to produce a larger background noise contribution, and the curves diverge.

Figure 12:
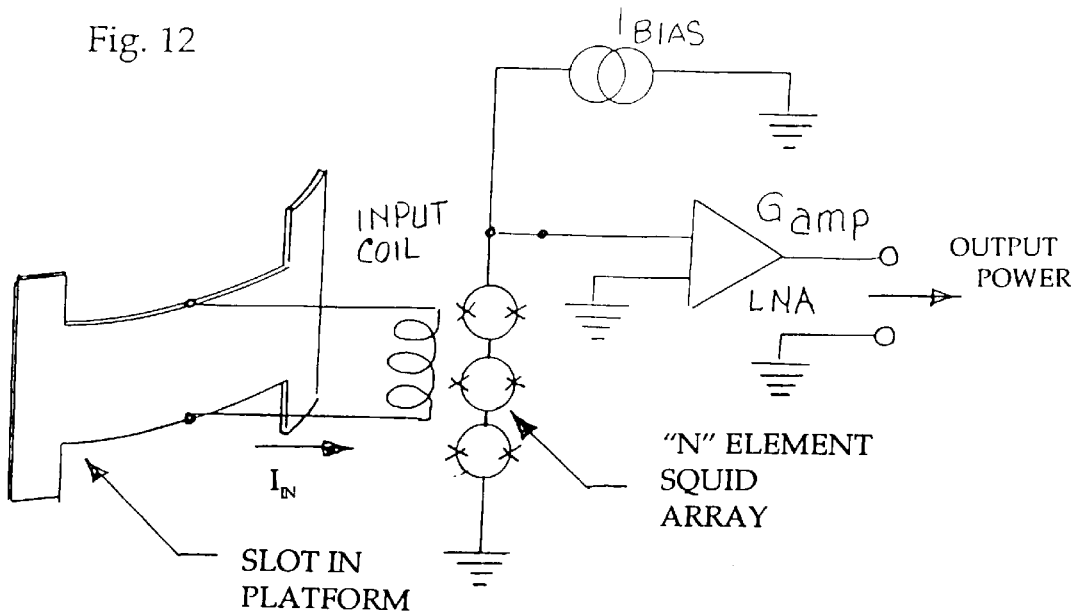
FIG. 12 is another preferred RF embodiment of the antenna of the present invention.
Figure 13:
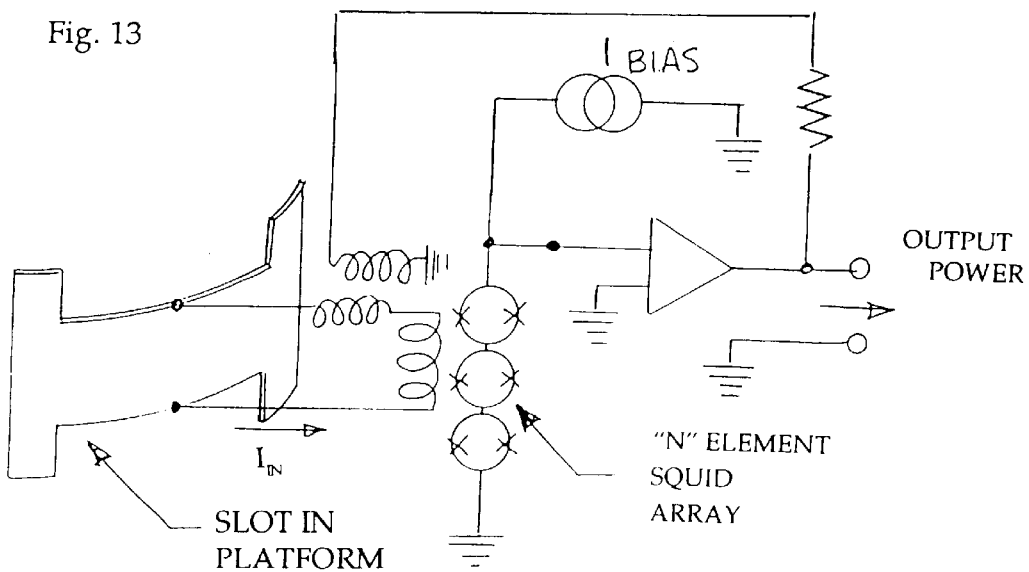
FIG. 13 is yet another preferred RF embodiment of the antenna using negative feedback.

FIGS. 12 and 13 illustrate two more RF embodiments of a SQUID antenna of the present invention for improving the performance of slot receivers. In both embodiments, a slot couples energy to an input coil for the SQUID array. The embodiment of FIG. 13 adds a negative feedback circuit to the antenna illustrated in FIG. 12. Both embodiments (and the electro-optical embodiment of FIG. 14) use a low noise amplifier (LNA). For the SQUID sensor, a high input impedance device is used to avoid loading of the SQUID array and the appropriate output impedance is used for matching to the transmission line load to which the antenna is connected. The LNA may be a standard semiconductor circuit or a superconducting circuit.

FIG. 14 illustrates an optical circuit for another embodiment of the antenna of the present invention. The optical circuit uses a series of Mach-Zehnder interferometers (or modulators) having electro-optical waveguides that are responsive to changes in a surrounding electric field. Three interferometers are shown in FIG. 14, but, as with the SQUID arrays, there can be many more interferometers in the actual device. The electric dipole antenna is generally an etched circuit pattern. In this optical embodiment, the electric field component of the incident illumination generates a voltage at the feed of the electric dipole antenna. This voltage is coupled to each interferometer where it alters the properties of the material (i.e., $LiNbO_3$, $KH_2PO_4$, etc.) in the electro-optical waveguides so as to modulate the optical signal carried in the fiber. The optical carrier signal is generated with a laser source. The modulated signal is combined after the interferometer array and is converted to an RF signal in a suitable photodetector. In each interferometer, a power splitter forms two light paths and the voltage (i.e., field) from the electric dipole antenna causes the waveguide associated with one path of the interferometer to modulate the optical carrier signal with a phase shift or time delay to produce interference when the optical signals are recombined. Using a series of these Mach-Zehnder devices enhances the amplitude modulation that results from the interference and extends the linear dynamic range. A photodetector connects the optical signal to RF using optical heterodyning techniques, which is amplified and processed in the same manner as the output from the SQUID in the other RF embodiments, especially those shown in FIGS. 12 & 13. While not illustrated in FIG. 14, the optical embodiment can also include feedback from the output signal to the electric dipole antenna in a similar manner to that shown for the RF circuit in FIG. 13. Additional details on the operation of electro-optic circuits are provided in U.S. Pat. No. 5,543,805," which we incorporate by reference.

Additional details of the design and performance of preferred SQUID arrays are disclosed in S. Hubbell et al., "Measurement and Simulation of the Voltage-Flux Transfer Function of SQUID Arrays," IEEE Trans. on App. Superconductivity, vol. 5, no. 2, June, 1995, 3255, and S. Hubbell et al., "High Linear Dynamic Range Magnetometer Utilizing a Large Array of Serially Connected SQUIDs," submitted to the IEEE Trans. on App. Superconductivity, which we also incorporate by reference.

From the foregoing it will be appreciated that, although specific embodiments of the invention have been described for purposes of illustration, various modifications may be made without deviating from the spirit and scope of the invention. Accordingly, the invention is not limited except as by the appended claims.

I claim:

1. A wideband, high linear dynamic range sensor for detecting incident electromagnetic radiation over a bandwidth from about DC to at least 10 GHz, comprising:

(a) a serial array of a plurality of transducing means coupling each transducing means with the incident electromagnetic radiation for providing an output signal indicative of the magnitude of the incident electromagnetic radiation;

(b) bias means, coupled to the array, for providing bias energy to every transducing means of the array;

(c) energy focusing means for collecting the incident electromagnetic radiation in a collected signal and for distributing the collected signal to the array so that the transducing means provide the output signal indicative of the magnitude of the incident electromagnetic radiation; and (d) negative, analog feedback means for coupling negative, analog feedback from the output signal to the energy focusing means to improve the linear dynamic range of the sensor wherein the transducing means are optical modulators for sequentially modulating the bias means in the form of an optical carrier signal transmitted through the optical modulators in series to modulate the optical carrier signal in response to the incident electromagnetic radiation.

2. The wideband, high linear dynamic range sensor, comprising (a) an array of serially connected Mach-Zehnder interferometers forming an optical circuit having an optical output;

(b) at least one electric dipole antenna for receiving an incident electric field and for electrically coupling the radiation received from the incident electric field to the interferometers;

(c) a laser source for feeding an optical carrier signal to the array of interferometers;

(d) a photodetector for converting the optical output of the array to an RF signal; and (e) feedback means responsive to the RF signal for providing feedback from the RF signal to the electric dipole antenna to increase linear dynamic range for the sensor.

3. A wideband, high linear dynamic range sensor for detecting incident electromagnetic radiation over a bandwidth from about DC to at least 10 GHz, comprising:

(a) a serial array of Mach-Zehnder interferometers coupling with the incident electromagnetic radiation to generate an array output indicative of the magnitude of the incident electromagnetic radiation;

(b) a laser source, coupled to the array to bias the interferometers by providing an optical carrier signal sequentially to every interferometer, the array output being a modulated optical signal arising from sequentially modulating the optical carrier signal in the interferometers in the serial array;

(c) at least one electric dipole antenna for collecting the incident electromagnetic radiation in a collected signal indicative of the magnitude of the incident radiation and for distributing the collected signal to interferometers; and (d) negative, analog feedback means for coupling negative, analog feedback from the array output to modulate the optical carrier signal to improve the linear dynamic range of the sensor, the feedback means including a photodetector for converting the array output into an RF signal.

4. A wideband, high linear dynamic range sensor for detecting incident electric fields in the range form DC to at least 10 GHz comprising:

(a) an array of at least three serially connected Mach-Zehnder interferometers, the array producing a single output with enhanced amplitude modulation because of the series of interferometers;

(b) an electric dipole antenna associated with each interferometer for receiving the incident electric field and for coupling the radiation received from the incident electric field to each interferometer;

(c) a laser source for feeding an optical carrier signal to the interferometers, the interferometers modulating the carrier signal in response to the incident electric field to produce the output;

(d) a photodetetor optically connected in series with the output for converting the output to an RF signal representative of the incident electric field; and (e) optionally, feedback means responsive to the RF signal for providing feedback to each electric dipole antenna to provide substantially larger linear dynamic range for the bandwidth.

5. The sensor of claim 4 further comprising low noise amplifier connected to the photodetector for amplifying the RF signal.

* * * * *